United States Patent [19]
Eisenstein et al.

[11] Patent Number: 5,241,190
[45] Date of Patent: Aug. 31, 1993

[54] APPARATUS FOR CONTACTING CLOSELY SPACED QUANTUM WELLS AND RESULTING DEVICES

[75] Inventors: James P. Eisenstein, Summit; Loren N. Pfeiffer, Morristown, both of N.J.

[73] Assignee: AT&T Bell Laboratories, Murray Hill, N.J.

[21] Appl. No.: 779,429

[22] Filed: Oct. 17, 1991

[51] Int. Cl.5 .................... H01L 29/06; H01L 31/072
[52] U.S. Cl. ..................................... 257/24; 257/192
[58] Field of Search .......... 357/16, 22, 22 A, 22 MD; 257/14, 20, 24, 192, 194

[56] References Cited

U.S. PATENT DOCUMENTS

| | | | |
|---|---|---|---|
| 4,806,998 | 2/1989 | Vinter et al. | 357/22 A |
| 4,907,045 | 3/1990 | Ando | 357/22 A |
| 4,999,682 | 3/1991 | Xu et al. | 357/16 |
| 5,021,841 | 6/1991 | Leburton et al. | 357/16 |
| 5,130,766 | 7/1992 | Arimoto et al. | 357/16 |

FOREIGN PATENT DOCUMENTS

| | | | |
|---|---|---|---|
| 0336172 | 10/1989 | European Pat. Off. | 357/16 |
| 59-111371 | 6/1984 | Japan | 357/22 MD |
| 60-57978 | 4/1985 | Japan | 357/22 A |
| 61-176160 | 8/1986 | Japan | 357/22 MD |
| 2-139973 | 5/1990 | Japan | 357/22 A |
| WO88/02557 | 4/1988 | PCT Int'l Appl. | 357/22 MD |

OTHER PUBLICATIONS

"Novel electron interferometers using field-induced decoupling in double quantum well structures", by Okuda et al, pp. 2231-2233, Appl. Phys. Lett. 57(21), Nov. 19, 1990.

"Velocity-Modulation Transistor (VMT)—A new field-effect transistor concept", by Sakaki, pp. L381-L383, Japanese Journal of Applied Physics, vol. 21, No. 6, Jun. 1982.

J. P. Eisenstein, et al. "Field-induced resonant tunneling between parallel two-dimensional electron systems," *Applied Physics Letters*, vol. 58, No. 14, pp. 1497-1499 (1991).

J. P. Eisenstein, et al. "Independently contacted two-dimensional electron systems in double quantum wells," *Applied Physics Letters*, vol. 57, No. 22, pp. 2324-2326 (1990).

*Primary Examiner*—Rolf Hille
*Assistant Examiner*—Steven Loke
*Attorney, Agent, or Firm*—Glen E. Books

[57] ABSTRACT

Quantum wells are typically formed in a semiconductor body comprising alternating barrier layers and quantum well layers. A longitudinal dimension can be defined along the layers, and the body has a pair of surfaces on opposite sides of the set of layers. In accordance with the invention, apparatus for contacting a plurality of layers within the semiconductor body comprises a first contact for contacting a plurality of wells at a first position and a second contact for contacting the wells at a second position longitudinally spaced apart from the first contact. A first electrode overlies and extends across the wells on one surface at a longitudinal position intermediate the two contacts, and second electrode on the opposite surface overlies and extends across the wells intermediate the contacts. By applying appropriate voltages to the electrodes, one or more of the underlying quantum wells can be selectively depleted locally of carriers, thereby controlling which of the wells can conduct between the contacts. This arrangement permits fabrication of a variety of new switching devices and transistors.

7 Claims, 3 Drawing Sheets

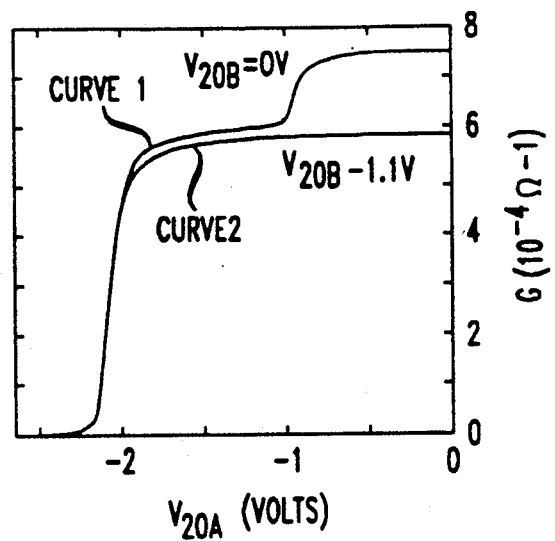
FIG. 4
FIG. 5
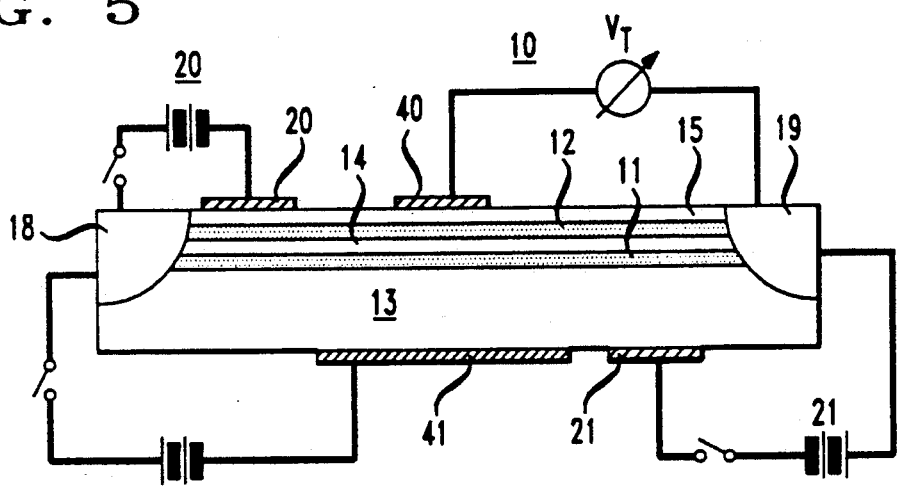
FIG. 6
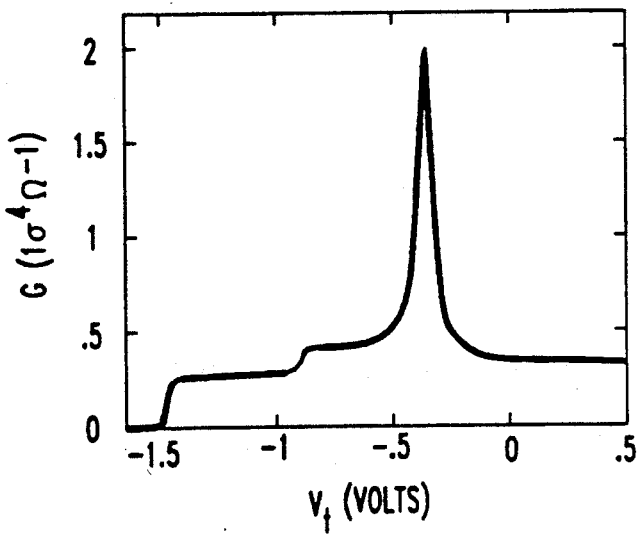

APPARATUS FOR CONTACTING CLOSELY SPACED QUANTUM WELLS AND RESULTING DEVICES

FIELD OF THE INVENTION

This invention relates to quantum well devices and, in particular, to apparatus for contacting closely-spaced quantum wells, such as a plurality of closely spaced two-dimensional electron gas layers. The apparatus permits fabrication of electron gas switches, and multiple layer transistors.

BACKGROUND OF THE INVENTION

Quantum wells are of considerable interest as components in the fabrication of high speed electronic devices. For example, a modulation-doped quantum well disposed between a pair of barrier layers can form a highly conductive layer referred to as a two-dimensional electron gas layer. Because the quantum well is free of dopant ions, electrons within the well exhibit much higher mobility than is found in conventional doped semiconductors. Such layers offer promise for use as interconnecting layers monolithically incorporated within semiconductors. Moreover, with close spacing between plural quantum layers, new types of devices can be designed using quantum mechanical tunneling between closely-spaced wells.

A difficulty impeding the development of such devices is the problem of making reliably electrical contact to individual quantum wells in a plurality of closely spaced wells. Because the wells are closely spaced—typically within a few hundred angstroms—conventional diffused electrical contacts to one quantum well also provide an appreciable conductive path to an adjacent well. Also because of the close spacing, efforts to isolate one well from another by conventional etching techniques require a control of etching depth not presently available on a reproducible basis. Accordingly, there is a need for apparatus for contacting individual ones of a plurality of closely-spaced quantum wells.

SUMMARY OF THE INVENTION

Quantum wells are typically formed in a semiconductor body comprising alternating barrier layers and quantum well layers. A longitudinal dimension can be defined along the layers, and the body has a pair of surfaces on opposite sides of the set of layers. In accordance with the invention, apparatus for contacting a plurality of layers within the semiconductor body comprises a first contact for contacting a plurality of wells at a first position and a second contact for contacting the wells at a second position longitudinally spaced apart from the first contact. A first electrode overlies and extends across the wells on one surface at a longitudinal position intermediate the two contacts, and second electrode on the opposite surface overlies and extends across the wells intermediate the contacts. By applying appropriate voltages to the electrodes, one or more of the underlying quantum wells can be selectively depleted locally of carriers, thereby controlling which of the wells can conduct between the contacts. This arrangement permits fabrication of a variety of new switching devices and transistors.

BRIEF DESCRIPTION OF THE DRAWINGS

The advantages, nature and various additional features of the invention will appear more fully upon consideration of the illustrative embodiments now to be described in detail in connection with the accompanying drawings. In the drawings:

FIG. 4 is a graphical illustration of the conductance characteristics of the device of FIG. 3;

FIG. 5 is a schematic cross section of a two-layer transistor in accordance with the invention;

FIG. 6 is a graphical illustration of the conductance-voltage characteristics of the device of FIG. 6;

It is to be understood that these drawings are for purposes of illustrating the concepts of the invention and, except for graphical illustrations, are not to scale.

DETAILED DESCRIPTION

Figure 1:
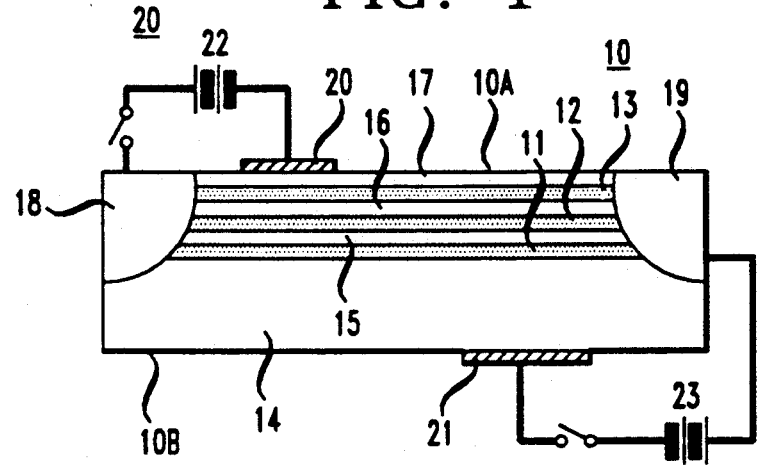
FIGS. 1 and 2 are a schematic cross section and top view, respectively, of apparatus for contacting a plurality of quantum wells in accordance with the invention.

Referring to the drawings, FIG. 1 is a schematic cross section of apparatus for contacting a plurality of spaced apart quantum wells. Specifically, the apparatus comprises a semiconductor body 10 having a plurality of quantum well layers 11, 12, and 13 alternating with barrier layers 14, 15, 16 and 17 to form a stack of quantum well regions. The body 10 typically has a pair of major surfaces 10A and 10B on opposite sides of the stack, and for convenience, the dimension along the stack layers can be referred to as the longitudinal dimension. Bodies with such stacks can be fabricated of gallium arsenide wells and aluminum gallium arsenide barriers using molecular beam epitaxy in accordance with techniques well known in the art. Preferably the wells are modulation dopes to act as two-dimensional electron gas layers.

Each of the quantum well layers 11, 12, and 13 is electrically contacted, as by a diffused contact 18 of metal such as indium at a first longitudinal position. Each well layer is also contacted by a second contact 19 at a position longitudinally spaced apart from the first contact 18.

Figure 2:
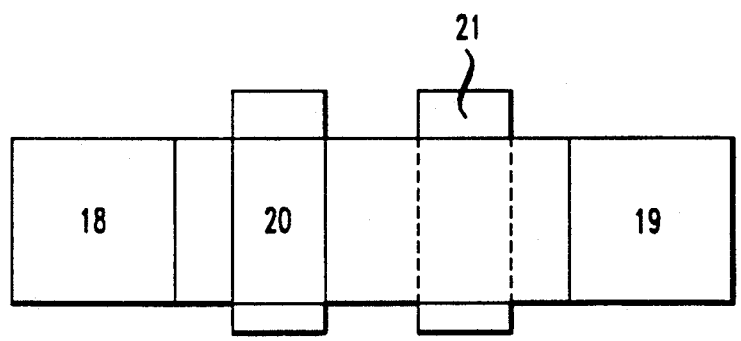

A first electrode 20 is disposed overlying a first surface 10A of the body 10 and overlying at least one of the quantum wells at a longitudinal position intermediate contacts 18 and 19, and a second electrode 21 is disposed overlying the opposing surface 10B intermediate the contacts. The electrodes extend across the conductive path established by the quantum wells. A first source of voltage 22 sufficient to locally deplete of carriers one or more of the underlying quantum well layers is connected to electrode 20, and a second source of voltage 23 sufficient to locally deplete one or more of the underlying wells is connected to electrode 21. Preferably the voltage sources are switchably connected between the electrodes and respective contacts, as illustrated in FIG. 1. As shown in FIG. 2, electrodes 20 and 21 extend substantially across the extend of the quantum well regions and preferably extend beyond for convenience in bonding leads.

In operation, the quantum well layers, in the absence of depletion voltages to the electrodes, act as high mobility conductive paths between contacts 18 and 19. Specifically, in the absence of depletion voltages, each of layers 11, 12 and 13 conduct. Application of an appropriate negative voltage selectively to electrode 20 depletes layer 13 of carriers in the region of 13 underlying the electrode with the consequence that only layers 11 and 12 conduct. Application of an enhanced negative voltage to electrode 20 locally depletes both layers 13 and 12 with the consequence that only layer 11 conducts. Application of an appropriate negative voltage to both electrodes 20 and 21 depletes layers 11 and 13, respectively, leaving only layer 12 to conduct. It can thus be seen that application of appropriate negative voltages to the electrodes permits selection of which layer or group of adjacent layers conducts between the contacts.

The structure, fabrication and operation of the invention can be understood in greater detail by consideration of the specific examples described below.

EXAMPLE 1

Channel Selecting Apparatus

Figure 3:
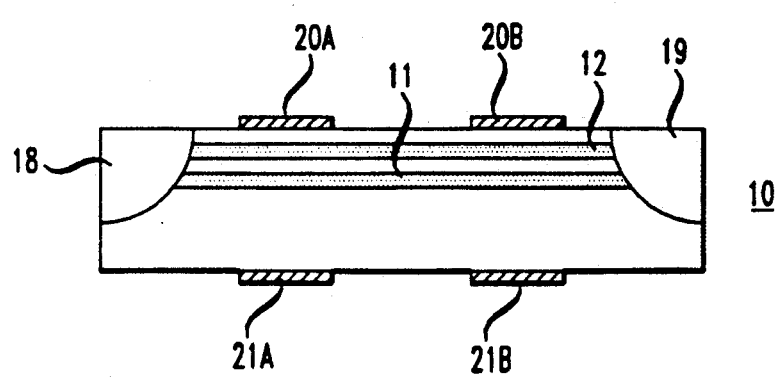
FIG. 3 is a schematic cross section of an exemplary apparatus in accordance with the invention.

FIG. 3 is a schematic cross section of a specific example of a contacting apparatus similar to that of FIGS. 1 and 2 except that the device comprises only tow quantum well layers 11 and 12 and includes pairs of electrodes 20A, 20B and 21A, 21B on each transverse surface of the body 10.

The exemplary device of FIG. 3 was fabricated on a (100) gallium arsenide substrate using molecular beam epitaxy to grow the following sequence layers: 0.3 $\mu$m of gallium arsenide buffer, 0.11 $\mu$m of undoped AlGaAs, a layer of silicon $\Delta$ doping of concentration $4 \times 10^{11}$ cm$^{-2}$, 900 Å of AlGaAs, 200 Å of gallium arsenide, 175 Å of AlGaAs, 200 Å of gallium arsenide, 700 Å of AlGaAs, a layer of silicon $\Delta$ doping of concentration $4 \times 10^{11}$ cm$^{-2}$, and 0.37 $\mu$m of AlGaAs. If the aluminum gallium arsenide is Al$_{0.3}$Ga$_{0.7}$As, then quantum wells have a carrier concentration of about $1.5 \times 10^{11}$ cm$^{-2}$.

Using conventional photolithographic processes, the structure shown in FIG. 3 is defined as a mesa by etching to the substrate the region external to the periphery. The lateral dimensions of the quantum well layers are 50 $\mu$m by 500 $\mu$m.

The top electrodes 20A and 20B are deposited through masks using conventional aluminum evaporation deposition. The top electrodes extend across the well regions and are each approximately 50 $\mu$m wide. The structure is then thinned, as by etching the backside, to a thickness of about 50 $\mu$m, and the bottom gate electrodes 21A and 21B are applied. Standard diffused indium contacts 18 and 19 are then formed at each end of the stack.

Operation of the device is illustrated by reference to FIG. 4 which graphically illustrates the conductance G between contacts 18 and 19. All measurements are at 1.5K. Curve 1 of FIG. 4 shows G as a function of the top electrode bias $V_{20A}$ for two different fixed voltages $V_{20B}$ on the top electrode 20B. With $V_{20B}$ biased to 0 V, G at first remains roughly constant as $V_{20A}$ is decreased until $V_{20A}$ reaches about $-0.9$ V. Then G drops rapidly to a lower plateau. Further decrease of $V_{20A}$ to about $-2.3$ V leads to a sharp drop off of the conductance to zero.

Curve 2 of FIG. 4 shows G versus $V_{20A}$ with the upstream top electrode 20B set at $V_{20B} = -1.1$ V. This voltage provides depletion of the upper electron gas layer 12 under top electrode 20B, while leaving the lower electron gas layer 11 nearly full. As $V_{20A}$ is decreased from zero there is no drop to a lower plateau when the upper electron gas layer under top electrode 20A depletes. This is because the upper layer is carrying no current since it is severed upstream by top electrode 20B. Only when top electrode 20A reaches around $-2$ V and begins to deplete the lower electron gas layer does G begin its drop to zero. Corresponding effects are observed when the bottom gates are used to deplete the lower channels, except that with the relatively large thicknesses of AlGaAs between the bottom electrodes and the lower electron gas layers, voltages must be about 100 times larger to effect depletion.

Depletion voltages required for the bottom electrodes can be reduced by locally etching the backside so that the electrodes 21A and 21B are closer to the quantum wells. Alternatively, back electrodes 21A and 21B can be integrally formed within the substrate close to the quantum wells by implanting silicon to form the electrode prior to growth of the quantum well stack.

EXAMPLE 2

Transistor

FIG. 5 is a schematic cross section of the contacting apparatus adapted for use as a transistor. In essence the apparatus is modified by an added top electrode 40, which can be called a tunnel gage, and an added bottom electrode 41. In the FIG. 5 structure, the quantum well layers 11 and 12 are two-dimensional electron gas layers separated by a sufficiently thin barrier layer 14 that quantum mechanical tunneling can take place between layers 11 and 12. However, conservation of momentum allows such tunneling only when the quantum well energy subbands in layers 11 and 12 are closely aligned.

As a specific example, such a transistor was fabricated on a gallium arsenide substrate using molecular beam epitaxy to grow the following successive layers: 0.11 micrometers of Al$_{0.3}$Ga$_{0.7}$As including a silicon delta doping layer of $4 \times 10^{11}$ cm$^{-2}$, a 140 angstrom GaAs quantum well, a 70 angstrom AlAs barrier layer, a 140 angstrom GaAs quantum well, and 0.45 micrometers of Al$_{0.3}$Ga$_{0.7}$As, including an additional silicon delta doping layer of equal concentration. The quantum wells each have a carrier concentration of about $1.5 \times 10^{11}$ cm$^{-2}$. As in the fabrication of the FIG. 3 device, indium contacts are made, the top aluminum electrodes are deposited, the back is thinned to about 50 micrometers and the bottom aluminum electrodes are deposited.

In operation, top gate 20 is biased to about $-1$ V to deplete the adjacent underlying portion of electron gas layer 12 and bottom gate 21 is biased to about $-135$ V to deplete the adjacent underlying portion of layer 11. With such biasing, the only current path from contact 18 to contact 19 is by way of quantum mechanical tunneling from layer 12 to layer 12. In this particular example, the layers 11 and 12, as made, have aligned energy subbands. As a consequence, a voltage was applied to electrode 41 in order to prevent a "normally on" condition by misaligning the subbands. Appropriate voltage to tunnel gate 40 realigns the subbands and produces sharp-peaked resonant tunneling.

FIG. 6 shows conductance-voltage characteristics of the FIG. 5 device. All measurements are at T=1.5K. Specifically, FIG. 6 is a plot of the conductance G between contacts 18 and 19 as a function of the voltage $V_t$ on tunnel gate 40 with bottom electrode 41 biased to −60 volts. A sharp resonant tunneling peak occurs at $V_t = -0.3$ V.

The necessity for electrode 41 can be eliminated by fabricating the quantum wells with misaligned energy subbands. For example, electrode 41 can be dispensed with if upper quantum well 12 is modulation doped with twice the concentration as quantum well 11. In this case the device is normally off, and the application of voltage to gate 40 align the subbands to enable tunneling.

Figure 7:
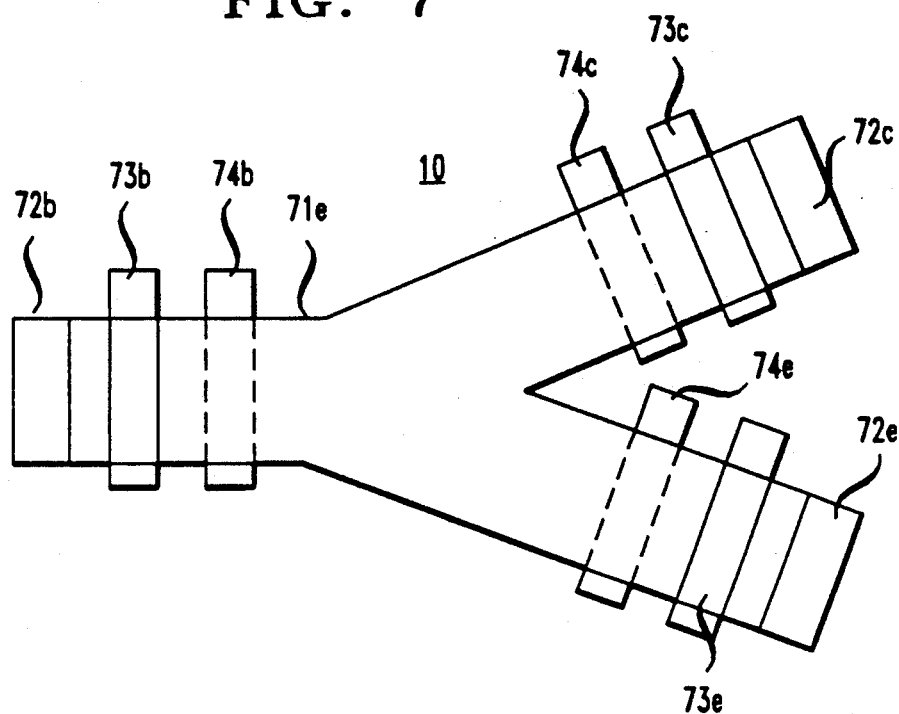
FIG. 7 is a schematic top view of a three-level transistor in accordance with the invention.
Figure 8:
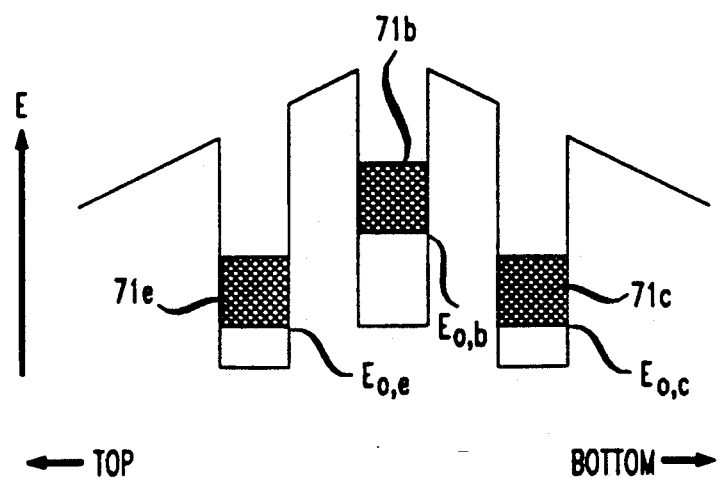
FIG. 8 is a schematic energy-level diagram useful in understanding the operation of the FIG. 7 device.

FIG. 7 is a schematic top view of a three-layer electron gas transistor in accordance with the invention. In essence, the transistor comprises a semiconductor body 10 including three overlying closely-spaced quantum wells 71e, 71b, and 71c, of which only 71e is shown in the top view. Contacts 72e, 72b and 72c are disposed at each of three laterally spaced apart positions, each contact making electrical contact with each of the three layers. Between each contact and the remainder of the device, here the junction of the "Y", are respective top electrodes 73e,73b, and 73c and respective bottom electrodes 74e,74b and 74c. As shown in FIG. 8, the three quantum wells are preferably fabricated with the outer two wells 71e and 71c provided with the same modulation doping so that the lower edges of their energy subbands Eo,e and Eo,c are in substantial alignment. The middle well 71b is preferably fabricated with a different level of modulation doping so that the lower edge Eo,b of its energy subband is not aligned with that of the outer two layers. With this misalignment, tunneling between layers is not significant and the device is normally off.

In operation contact 72b can be considered the base contact. Electrode 73b is biased to locally deplete layer 71e and electrode 74b is biased to deplete layer 71c. Contact 72e can be considered the emitter contact. Electrode 74e is biased to locally deplete both layer 71c and 71b. Contact 72c can be considered the collector contact, and electrode 73c is biased to locally deplete both layers 71e and 71b. Electrodes 74c and 73e can be shorted to their respective adjacent contacts or be omitted. Bias voltage between contacts 72b and 72e is chosen to place the energy levels Eo,e,Eo,b and Eo,c in near alignment. In this condition, significant tunneling can occur between all three layers, and, for example, the e-c current can have a sharp response peak for variations in the b-e voltage.

It is to be understood that the above-described embodiments are illustrative of only a few of the many possible specific embodiments which can represent applications of the principles of the invention. Numerous and varied other arrangements can be readily devised in accordance with these principles by those skilled in the art without departing from the spirit and scope of the invention.

We claim:

1. Apparatus for contacting a plurality of spaced apart quantum wells within a semiconductor body comprising:
   a semiconductor body comprising alternating barrier layers and quantum well layers, said body having a longitudinal dimension along said layers and a pair of surfaces on opposite sides of said layers;
   first contact means for electrically contacting a plurality of quantum wells in said body at a first longitudinal position;
   second contact means for electrically contacting said plurality of quantum wells at a second position longitudinally spaced apart from said first contact means;
   first electrode means on a first surface of said body overlying at least one of said quantum wells at a longitudinal position intermediate said first and second contact means for applying a voltage capable of locally depleting at least one of said underlying quantum wells; and
   second electrode means on a second surface of said body opposite said first surface overlying at least one of said quantum wells at a longitudinal position longitudinally intermediate said contact means for applying a voltage capable of locally depleting at least one of said quantum wells.

2. Apparatus according to claim 1 wherein one or more of said quantum wells are modulation-doped to define a two-dimensional electron gas layer.

3. Apparatus according to claim 1 further comprising third electrode means for applying a voltage for altering the energy band for electrons in a quantum well layer underlying said third electrode.

4. Apparatus according to claim 1 wherein a pair of said quantum wells are spaced apart by a barrier layer having a thickness of less than about 200 angstroms.

5. Apparatus according to claim 1 wherein said barrier layers comprise aluminum gallium arsenide and said quantum well layers comprise gallium arsenide.

6. Apparatus according to claim 1, 2 or 4 is a channel selecting device.

7. Apparatus according to claim 1 further comprising a plurality of additional electrode means for applying between at least a pair of said quantum wells, voltages sufficient to align or misalign the energy subbands of said quantum wells.

* * * * *